US008165553B2

(12) United States Patent
Lou et al.

(10) Patent No.: US 8,165,553 B2
(45) Date of Patent: Apr. 24, 2012

(54) CURRENT-MATCHING INTERMODULATION SUPPRESSION

(75) Inventors: Shuzuo Lou, Shatin (HK); Weimin Zhang, Shatin (HK); Wai Po Wong, Shatin (HK); Gang Qian, Shatin (HK)

(73) Assignee: Hong Kong Applied Science and Technology Research Institute Company Limited, New Territories (HK)

( * ) Notice: Subject to any disclaimer, the term of this patent is extended or adjusted under 35 U.S.C. 154(b) by 333 days.

(21) Appl. No.: 12/683,384

(22) Filed: Jan. 6, 2010

(65) Prior Publication Data

US 2011/0165854 A1 Jul. 7, 2011

(51) Int. Cl.
*H04B 1/10* (2006.01)
(52) U.S. Cl. .......................... 455/295; 455/323; 455/333
(58) Field of Classification Search .................. 455/254, 455/295, 296, 323, 324, 330, 333, 334; 327/113, 327/355, 357, 358, 359
See application file for complete search history.

(56) References Cited

U.S. PATENT DOCUMENTS

| | | | |
|---|---|---|---|
| 6,992,519 B2 | 1/2006 | Vilander et al. | |
| 7,177,620 B1 * | 2/2007 | Tsai et al. | 455/333 |
| 2005/0143044 A1 | 6/2005 | Kim | |
| 2006/0135109 A1 * | 6/2006 | Klumperink et al. | 455/323 |
| 2007/0049215 A1 | 3/2007 | Chen et al. | |
| 2010/0029234 A1 * | 2/2010 | Joos et al. | 455/209 |
| 2012/0019304 A1 * | 1/2012 | Chen et al. | 327/355 |

FOREIGN PATENT DOCUMENTS

EP 1841230 A1 10/2007

OTHER PUBLICATIONS

Myung-Woon Hwang, A high IIP2 direct-conversion mixer using an even-harmonic reduction technique for cellular CDMA/PCS/GPS applications, 2004 IEEE RFIC Symposium, Jun. 6-8, 2004.
Brandolini, M., et al., A +78 dBm IIP2 CMOS direct downconversion mixer for fully integrated UMTS receiver, IEEE Journal of Solid-State Circuits, Mar. 2006, .vol. 41, No. 3.

* cited by examiner

*Primary Examiner* — Thanh Le
(74) *Attorney, Agent, or Firm* — Ella Cheong Hong Kong; Margaret A. Burke; Sam T. Yip

(57) ABSTRACT

A circuit is provided for suppression of second-order intermodulation in a double-balanced mixer circuit. The circuit includes a duplicate transconductor element for duplicating AC current in a transconductor pair of the double-balanced mixer circuit. A fundamental cancellation element cancels a fundamental component of an AC current of the duplicate transconductor element, while preserving a second-order intermodulation component. A phase inversion element feeds an output current of the fundamental cancellation element to the transconductor pair of the double-balanced mixer circuit, to substantially remove the second-order intermodulation component from a differential output of the double-balanced mixer circuit.

11 Claims, 7 Drawing Sheets

CURRENT-MATCHING INTERMODULATION SUPPRESSION

TECHNICAL FIELD

The present invention relates generally to radio frequency electronics and, in particular, to suppression of second-order intermodulation in balanced mixer circuits.

BACKGROUND

Low-cost receivers for radio frequency (RF) communications frequently make use of CMOS technology. An RF receiver front-end includes a down-conversion mixer, which is a circuit that converts input RF signals directly to baseband frequencies by multiplication with a signal from a local oscillator (LO), as illustrated in FIG. 1a, in which an RF signal 100 centred on the radio frequency $f_0$ is multiplied by a signal 110 from a local oscillator at frequency $f_0$ by a mixer 120. The result is a baseband signal 130.

However, because of the fundamental nonlinear characteristics of MOS transistors in the RF frequency range, CMOS mixers do not act as ideal multiplier circuits. Rather, such mixers implement a two-variable polynomial on the input signals:

$$v_{out} = a_1 v_1 v_2 + a_{21} v_1^2 v_2 + a_{12} v_1 v_2^2 + a_{31} v_1^3 v_2 + a_{13} v_1 v_2^3 + a_{22} v_1^2 v_2^2 + \ldots \quad (1)$$

The result of such nonlinearity can be unwanted baseband components, as illustrated in FIG. 1b. An RF signal 140 containing information centred on the radio frequency $f_0$, with two closely spaced interfering signals at higher frequencies $f_1$ and $f_2$, is mixed by the mixer 150 with the local oscillator signal 160. The output signal 170 comprises the desired baseband component and two components at $f_1-f_0$ and $f_2-f_0$, well outside the baseband, all produced by the first order ($a_1$) term in equation (1), and a weaker tone at $f_2-f_1$ within the baseband, produced by the second-order "intermodulation" (IM2) terms ($a_{12}$ and $a_{21}$) in equation (1). Other interfering tones are produced by the third-order intermodulation (IM3) terms ($a_{31}$, $a_{13}$, and $a_{22}$) in equation (1). The amount of intermodulation distortion is characterised by the second- and third-order intercept points IIP2 and IIP3 respectively. The higher these values, the lower is the corresponding intermodulation term.

Double-balanced mixer circuits such as the Gilbert cell 200 shown in FIG. 2 have high gain and good suppression of common-mode noise and even-order intermodulation terms, which are also common-mode. The RF input transistors $M_1$ and $M_2$ are known as the transconductors or $g_m$-stage transistors 220, $M_0$ as the bias transistor because of its DC gate voltage setting the DC bias current $I_0$, and the transistors $M_3$, $M_4$, $M_5$, and $M_6$ as the "switching quad" 210. The IIP2 of the Gilbert cell 200 is set by the second-order nonlinearity of the transconductors 220 and the mismatches between the transistors in the switching quad 210 and between the load resistors $R_1$ and $R_2$.

Conventional approaches to IM2 suppression in double-balanced mixers have been found to lack stability over a wide bandwidth, worsen IM3 performance or noise figure, or consume too much power or integrated circuit area.

SUMMARY

It is an object of the present invention to substantially overcome, or at least ameliorate, one or more disadvantages of existing configurations.

According to a first aspect of the present invention, there is provided a circuit for suppression of second-order intermodulation in a double-balanced mixer circuit. The circuit includes a duplicate transconductor element for duplicating AC current in a transconductor pair of the double-balanced mixer circuit; a fundamental cancellation element for cancelling a fundamental component of an AC current of the duplicate transconductor element, while preserving a second-order intermodulation component; and a phase inversion element for feeding an output current of the fundamental cancellation element to the transconductor pair of the double-balanced mixer circuit, thereby substantially removing the second-order intermodulation component from a differential output of the double-balanced mixer circuit.

Other aspects of the invention are also disclosed.

BRIEF DESCRIPTION OF THE DRAWINGS

One or more embodiments of the present invention are described hereinafter with reference to the drawings, in which.

DETAILED DESCRIPTION INCLUDING BEST MODE

Figure 1A:
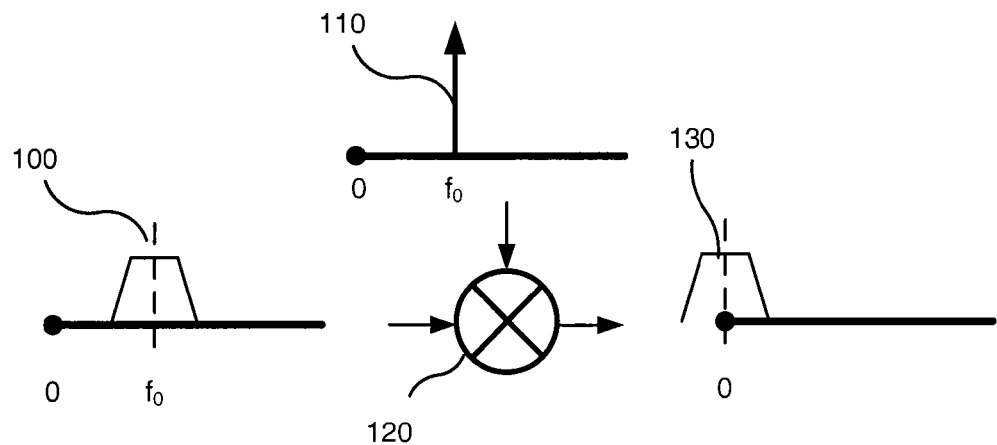
FIG. 1a illustrates the operation of an ideal mixer circuit.
Figure 1B:
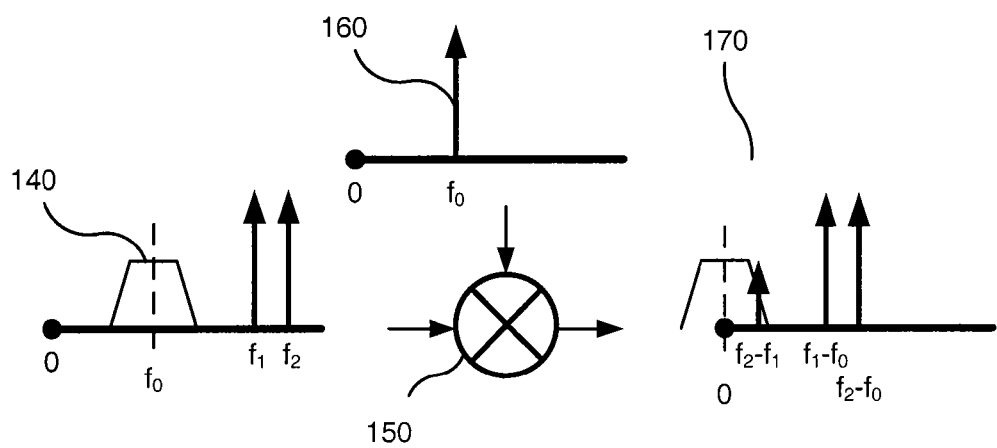
FIG. 1b illustrates the effects of nonlinearity in a practical mixer circuit.

Where reference is made in any one or more of the accompanying drawings to steps and/or features, which have the same reference numerals, those steps and/or features have for the purposes of this description the same function(s) or operation(s), unless the contrary intention appears.

Figure 2:
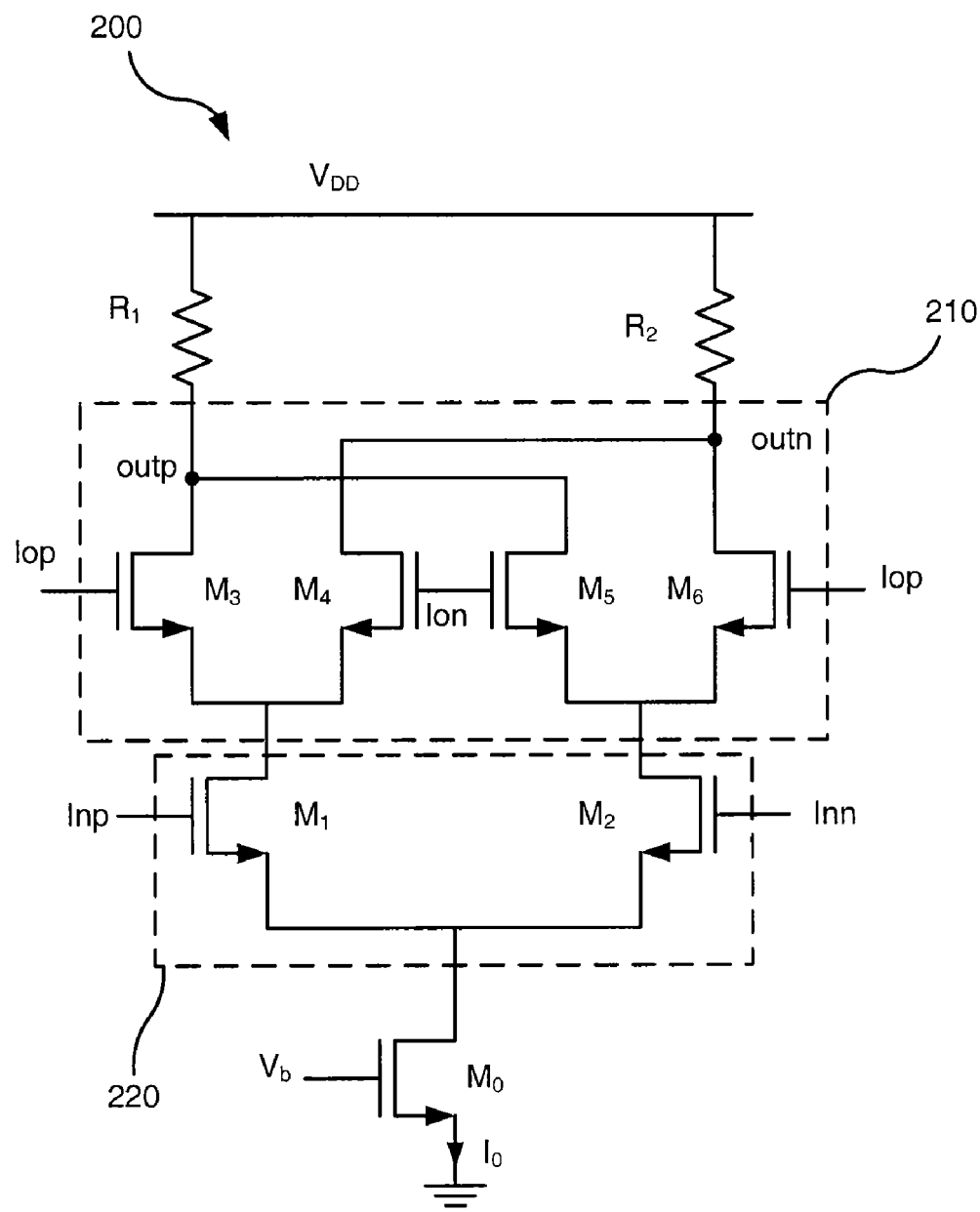
FIG. 2 is a schematic diagram of a Gilbert cell double-balanced mixer circuit.
Figure 3:
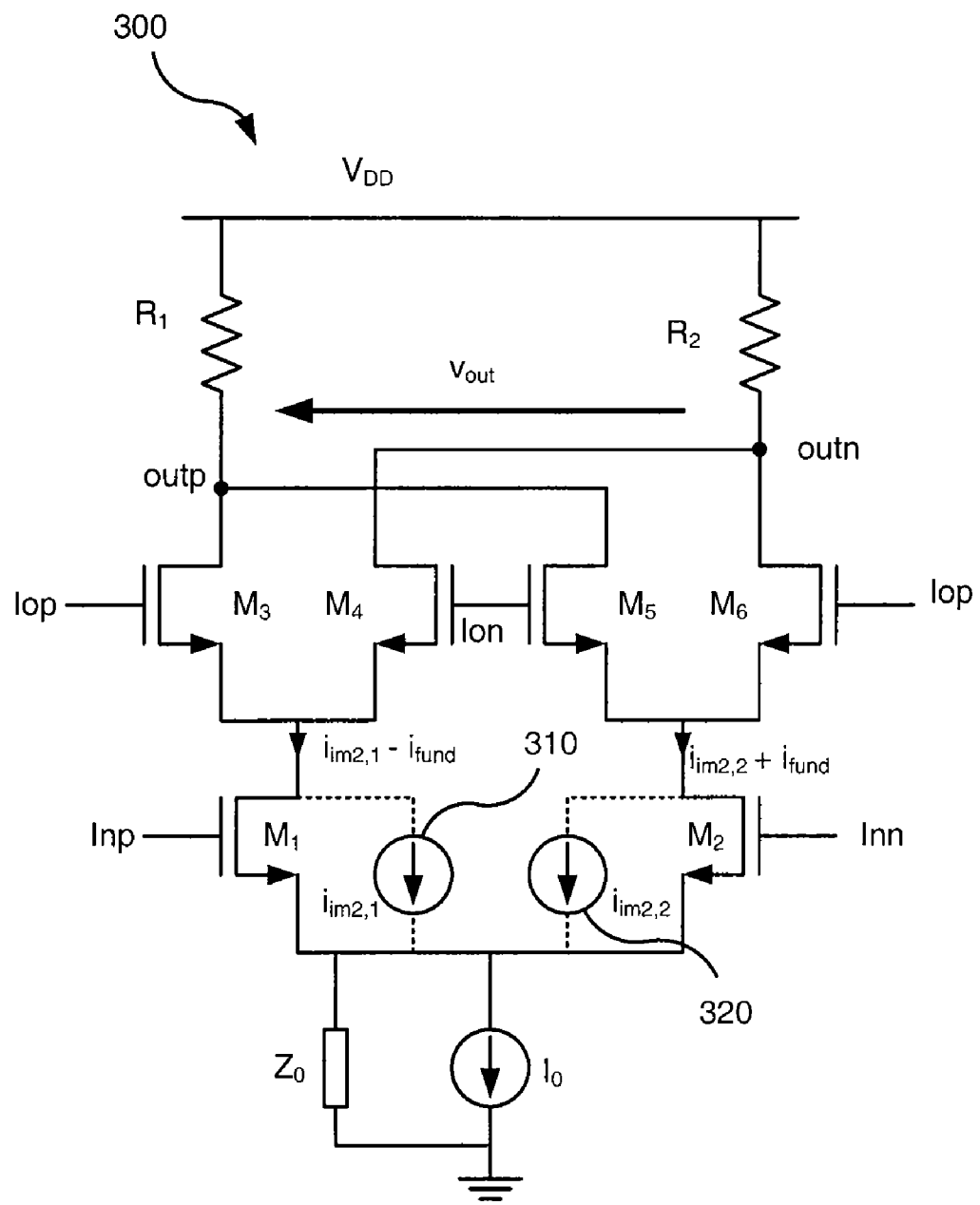
FIG. 3 is a schematic diagram showing the second-order intermodulation currents in the Gilbert cell double-balanced mixer circuit of FIG. 2.

FIG. 3 is a schematic diagram showing the second-order intermodulation (IM2) currents in the Gilbert cell double-balanced mixer circuit 200 of FIG. 2, reproduced as the circuit 300. $Z_0$ represents the finite output impedance of the current source $I_0$.

The AC currents $i_{im2,1}$ and $i_{im2,2}$, which are modelled as AC current sources 310 and 320 in parallel with the transconductors $M_1$ and $M_2$ respectively, are generated from the $2^{nd}$-order nonlinearity of transconductors $M_1$ and $M_2$, as introduced in equation (1). If differential signals are applied to the gates of $M_1$ and $M_2$, and $M_1$ and $M_2$ are matched, giving $$i_{im2,2} = i_{im2,1} = \frac{i_{im2}}{2} \quad (2)$$

The differential output signal generated by the IM2 current in M1 and M2 may be approximated as $$v_{out,im2} = \left(i_{im2,1}\frac{g_{m3}}{g_{m3}+g_{m4}} + i_{im2,2}\frac{g_{m5}}{g_{m5}+g_{m6}}\right)R_1 - \left(i_{im2,1}\frac{g_{m4}}{g_{m3}+g_{m4}} + i_{im2,2}\frac{g_{m6}}{g_{m5}+g_{m6}}\right)R_2 \quad (3)$$

Defining the mean and differential load resistance respectively of the switching quad $M_3$, $M_4$, $M_5$, and $M_6$ as $$R = \frac{1}{2}(R_1 + R_2) \quad (4)$$

$$\Delta R = R_1 - R_2 \quad (5)$$

and the mean and differential size of a given transistor pair $(M_i, M_j)$ in the switching quad as $$W_{ij} = \frac{1}{2}(W_i + W_j) \quad (6)$$

$$\Delta W_{ij} = W_i - W_j \quad (7)$$

it may be shown using equation (2Error! Reference source not found.) that $$v_{out,im2} \approx \frac{i_{im2}}{2}R\left(\frac{\Delta W_{ij}}{W_{ij}} + \frac{\Delta R}{R}\right) \quad (8)$$

That is, the output signal due to IM2 current is proportional to the relative mismatch between the transistors $M_3$, $M_4$, $M_5$, and $M_6$ in the switching quad and to the relative mismatch between the two load resistors $R_1$ and $R_2$.

Figure 4:
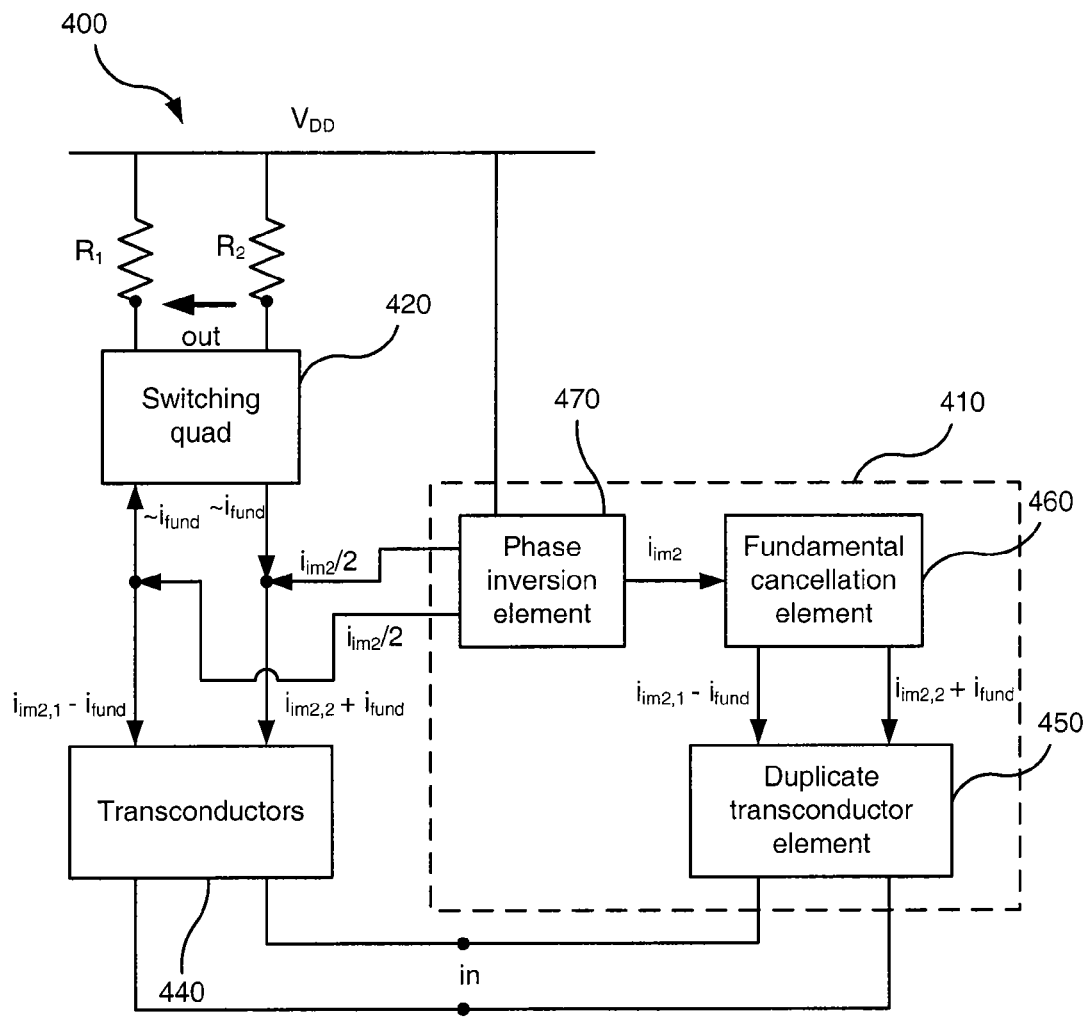
FIG. 4 is a block diagram showing the Gilbert cell double-balanced mixer circuit of FIG. 2 with a current-matching IM2 suppression circuit according to a first embodiment.

FIG. 4 is a block diagram showing the Gilbert cell double-balanced mixer circuit 200 of FIG. 2 reproduced in block form 400 with a current-matching IM2 suppression circuit 410 according to a first embodiment of the present invention. The current-matching IM2 suppression circuit 410 is said to be in the "feedforward path" while the Gilbert cell 400 is said to be in the "main path".

The current-matching IM2 suppression circuit 410 comprises a duplicate transconductor element 450 connected to the balanced inputs of the Gilbert cell 400, a fundamental cancellation element 460 connected to the drains of the duplicate transconductor element 450, and a phase inversion element 470 connected between the fundamental cancellation element 460 and the drains of the transconductor pair 440 of the Gilbert cell 400. The duplicate transconductor element 450 contains duplicates of the transconductor pair 440 of the Gilbert cell 400, biased in the same condition as the transconductor pair 440 of the Gilbert cell 400. The AC drain currents of the duplicate transconductor element 450 are therefore substantially equal to the AC drain currents of the transconductor pair 440 of the Gilbert cell 400, namely $i_{im2,1}-i_{fund}$ and $i_{im2,2}+i_{fund}$. The fundamental cancellation element 460 cancels the fundamental component $i_{fund}$ of the AC drain currents of the duplicate transconductor element 450, leaving only the IM2 current $i_{im2}$ flowing out of the fundamental cancellation element 460. The phase inversion element 470 reverses the direction of the output current $i_{im2}$ of the fundamental cancellation element 460, divides the reversed current into two halves, and feeds each half back to a corresponding drain of the transconductor pair 440 of the Gilbert cell 400. The IM2 current is thus substantially removed from the switching quad 420 of the Gilbert cell 400, while the fundamental component $i_{fund}$ reaching the differential output of the Gilbert cell 400 is substantially unaffected.

Figure 5:
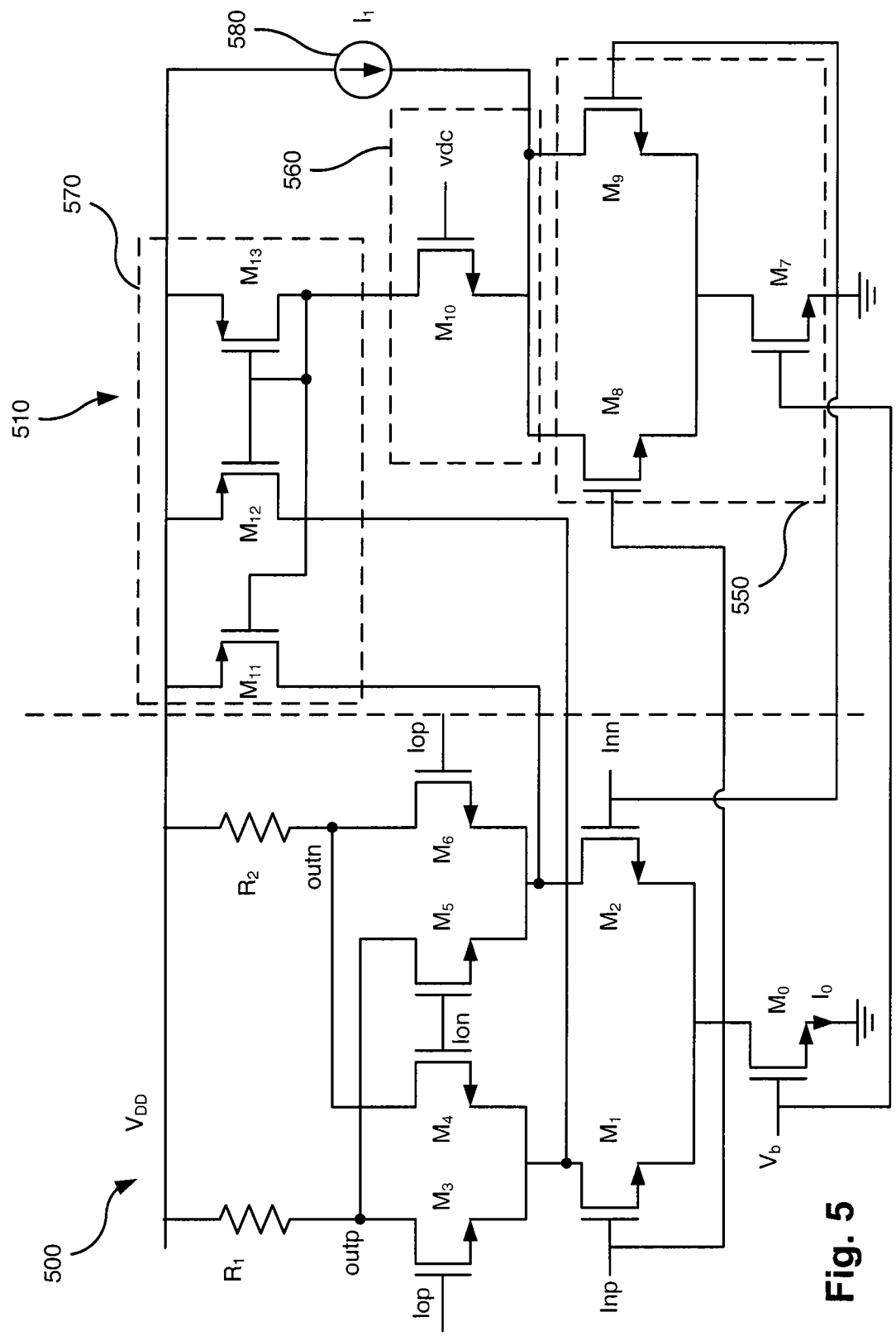
FIG. 5 is a schematic diagram of the Gilbert cell double-balanced mixer circuit of FIG. 2 with a current-matching IM2 suppression circuit that implements the current-matching IM2 suppression circuit of FIG. 4.

FIG. 5 is a schematic diagram of the Gilbert cell double-balanced mixer circuit 200 of FIG. 2, reproduced as the circuit 500, with a current-matching IM2 suppression circuit 510 that implements the current-matching IM2 suppression circuit 410 of FIG. 4. The duplicate transconductor element 550 (corresponding to the duplicate transconductor element 450) comprises two transconductors $M_8$ and $M_9$ and a bias transistor $M_7$ that respectively duplicate the transconductors $M_1$ and $M_2$ and the bias transistor $M_0$ in the Gilbert cell 500. $M_8$, $M_9$, and $M_7$ are biased in the same condition as $M_1$, $M_2$, and $M_0$ (i.e. have the same current density, drain-source voltage and gate-source voltage), while $M_8$ and $M_9$ have the same RF differential inputs (inp and inn) as $M_1$ and $M_2$. The only difference is a scaling factor k on the transistor size, i.e.

$$\frac{W_7}{W_0} = \frac{W_{8,9}}{W_{1,2}} = k \quad (9)$$

with $0<k<1$. $M_8$ and $M_9$ therefore have the same AC drain currents as $M_1$ and $M_2$, namely $i_{im2,1}-i_{fund}$ and $i_{im2,2}+i_{fund}$, scaled by k. The fundamental cancellation element 560 (corresponding to the fundamental cancellation element 460) therefore comprises a connection of the drains of $M_8$ and $M_9$, which adds the two drain currents, cancelling $k*i_{fund}$ and leaving only the IM2 current $k*i_{im2}$ as the AC component of the output current. The DC component of the output current is simply the bias current supplied by $M_7$, namely $k*I_0$.

The fundamental cancellation element 560 also comprises a cascade transistor $M_{10}$, which acts as a cascade device to match the DC drain-source voltage between the duplicate transconductors $M_8$ and $M_9$ and the original transconductors $M_1$ and $M_2$. The better $M_1$ and $M_2$ are matched to $M_8$ and $M_9$ (including their drain voltages), the better is the current matching, and finally the IM2 suppression. The size of $M_{10}$ is scaled by 4k with respect to the average size of the switching quad $M_3$, $M_4$, $M_5$, and $M_6$ in the Gilbert cell 500:

$$\frac{W_{10}}{W_{3,4,5,6}} = 4k \quad (10)$$

The transistors $M_{11}$, $M_{12}$, and $M_{13}$, whose respective gates and sources are connected together, form a current mirror 570 to mirror the drain current of $M_{13}$, which is equal to the drain current of $M_{10}$, namely the scaled IM2 current $k*i_{im2}$. The current mirror 570 corresponds to the phase inversion element 470.

The transistors $M_{11}$ and $M_{12}$ are matched to $M_{13}$ except for a size scaling factor of 2k, i.e.

$$\frac{W_{13}}{W_{11,12}} = 2k \qquad (11)$$

Because of the size scaling of 2k between $M_{11}$ and $M_{13}$, and between $M_{12}$ and $M_{13}$, the current mirror 570 divides the drain current of $M_{13}$ by 2k, so the drain currents of $M_{11}$ and $M_{12}$ are each equal to $i_{im2}/2$. These currents are injected back into the Gilbert cell 500 at the drains of the transconductors $M_1$ and $M_2$. The IM2 current is thus substantially removed from the switching quad of the Gilbert cell 500, while the fundamental component $i_{fund}$ reaching the differential output of the Gilbert cell 500 is substantially unaffected. Thus, the goal of suppressing the IM2 current at the mixer output without affecting the fundamental operation is achieved. Smaller values of the scaling factor k give lower-power and lower-size operation of the current-matching IM2 suppression circuit 510. In principle, the amount of suppression is independent of the value of k. In practice, setting k too small adversely affects matching, and therefore the amount of suppression.

A DC current source 580, with value $I_1 = k*I_0*m$, is connected to the drains of the duplicate transconductor pair $M_8$ and $M_9$. The DC current source 580 allows the setting of different DC current levels between the current mirror ($M_{11}$ and $M_{12}$) and the transconductors $M_1$ and $M_2$ in the Gilbert cell 500, so that a DC current of $I_0*m$ remains in the switching quad ($M_3$, $M_4$, $M_5$, and $M_6$) of the Gilbert cell 500 for proper biasing. The value of m is typically set in the range 0.3 to 0.7.

The amount of IM2 suppression achieved by the current-matching IM2 suppression circuit 510 is determined by the closeness of the matching between the respective transistors in the main and feedforward paths, and is therefore robust to PVT (process, voltage, and temperature) variations. In addition, the current-matching IM2 suppression circuit 510 can be manufactured in any standard CMOS process as no special device is required, and because it does not use the feedback path, the current-matching IM2 suppression circuit 510 is stable over a wide frequency range.

Table 1 compares the simulated performance of the Gilbert cell 500 without the current-matching IM2 suppression circuit 510 with that of the Gilbert cell 500 with the current-matching IM2 suppression circuit 510 at an operating frequency of 900 MHz. In this and the following simulations, k was set to 0.1 and m to 0.667.

TABLE 1

Comparison of Gilbert cell performance without and with IM2 suppression circuit

|  | Without IM2 suppression circuit | With IM2 suppression circuit |
| --- | --- | --- |
| Gain | 3.9 dB | 4.0 dB |
| Single-ended IIP2 | 27.5 dBm | 54.5 dBm |
| Noise figure | 16.0 dB | 16.0 dB |
| IIP3 | 6.4 dBm | 6.5 dBm |
| Current @ 1.8 V | 2.3 mA | 2.6 mA |

Table 1 shows that the IIP2 point is 27 dB higher with the current-matching IM2 suppression circuit 510, without significantly worsening gain, noise figure, IIP3 point, or power consumption. Further simulations show that this improvement only declines to 26.5 dB at a temperature of 85° C. and a rail voltage of 1.98V under the fast-fast CMOS process, and to 14.7 dB at a temperature of −40° C. and a rail voltage of 1.62 V under the slow-slow CMOS process.

Figure 6:
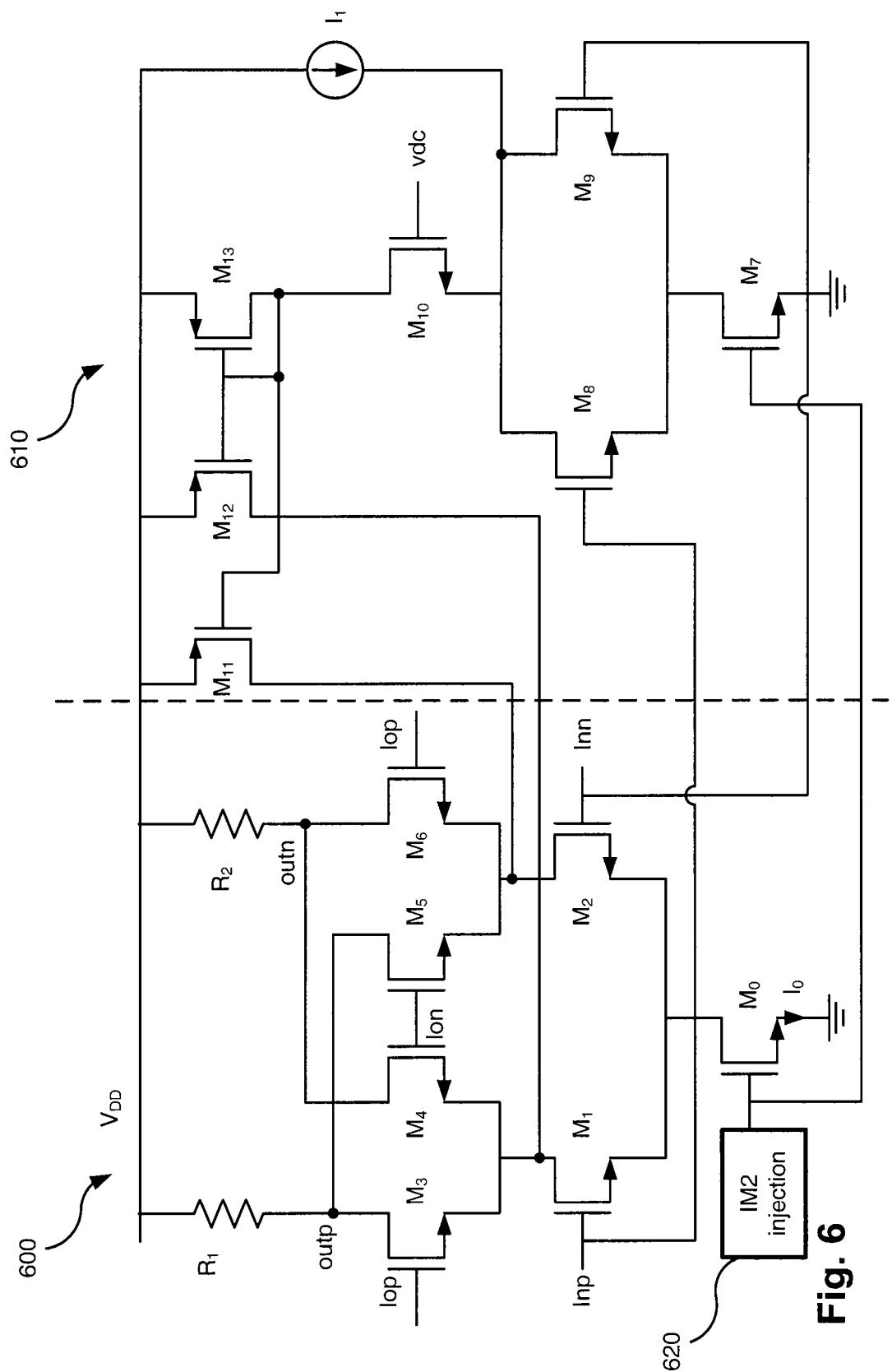
FIG. 6 is a schematic diagram of a linearised Gilbert cell double-balanced mixer circuit with the current-matching IM2 suppression circuit of FIG. 5.

FIG. 6 is a schematic diagram of a linearised Gilbert cell double-balanced mixer circuit 600 with a current-matching IM2 suppression circuit 610. The current-matching IM2 suppression circuit 610 is the same as the current-matching IM2 suppression circuit 510 of FIG. 5, while the linearised Gilbert cell 600 is the same as the Gilbert cell double-balanced mixer circuit 500 of FIG. 5, with the addition of an IM2 injection circuit 620 at the gate of the bias transistor $M_0$. The IM2 injection circuit 620 injects the envelope (IM2) of the RF signals with appropriate magnitude and phase. The purpose of the IM2 injection circuit 620, as is known in the art of mixer design, is to reduce third-order intermodulation terms in the mixer output, or equivalently increase the IIP3 point. The disadvantage of the linearised Gilbert cell 600 is that second-order intermodulation suppression is degraded due to the active injection of IM2 terms.

The IM2 from the IM2 injection circuit 620 is also injected into the gate of the bias transistor $M_7$ of the current-matching IM2 suppression circuit 610. The current-matching IM2 suppression circuit 610 therefore experiences the same inputs as the linearised Gilbert cell 600 and will lift its IM2 current to match that in the linearised Gilbert cell 600. This current is injected back into the linearised Gilbert cell 600 at the drains of the transconductors $M_1$ and $M_2$. The increased IM2 current is thus substantially removed from the switching quad of the linearised Gilbert cell 600 so that increased IM2 current does not appear at the differential output. The use of the current-matching IM2 suppression circuit 610 with the linearised Gilbert cell 600 can therefore achieve IM2 and IM3 suppression at the same time.

Table 2 compares the simulated performance of the linearised Gilbert cell 600 without the current-matching IM2 suppression circuit 610 with that of the linearised Gilbert cell 600 with the current-matching IM2 suppression circuit 610 at an operating frequency of 900 MHz:

TABLE 2

Comparison of linearised Gilbert cell performance without and with IM2 suppression circuit

|  | Without IM2 suppression circuit | With IM2 suppression circuit |
| --- | --- | --- |
| Gain | 3.9 dB | 4.0 dB |
| Single-ended IIP2 | −7.1 dBm | 21.3 dBm |
| Noise figure | 16.0 dB | 15.8 dB |
| IIP3 | 12.7 dBm | 12.7 dBm |
| Current @ 1.8 V | 2.4 mA | 2.7 mA |

A comparison of Table 2 and Table 1 shows that the linearised Gilbert cell 600 has an IIP3 point that is 6.3 dB higher than the Gilbert cell 500, and that this improvement is not compromised at all with the addition of the current-matching IM2 suppression circuit 610. Moreover, the dramatic worsening of the IIP2 point in the linearised Gilbert cell 600 compared to that in the Gilbert cell 500 (by some 35 dB) is mitigated by the current-matching IM2 suppression circuit 610, which reduces IM2 by roughly the same amount (28.4 dB) as the current-matching IM2 suppression circuit 510 did for the Gilbert cell 500.

Figure 7:
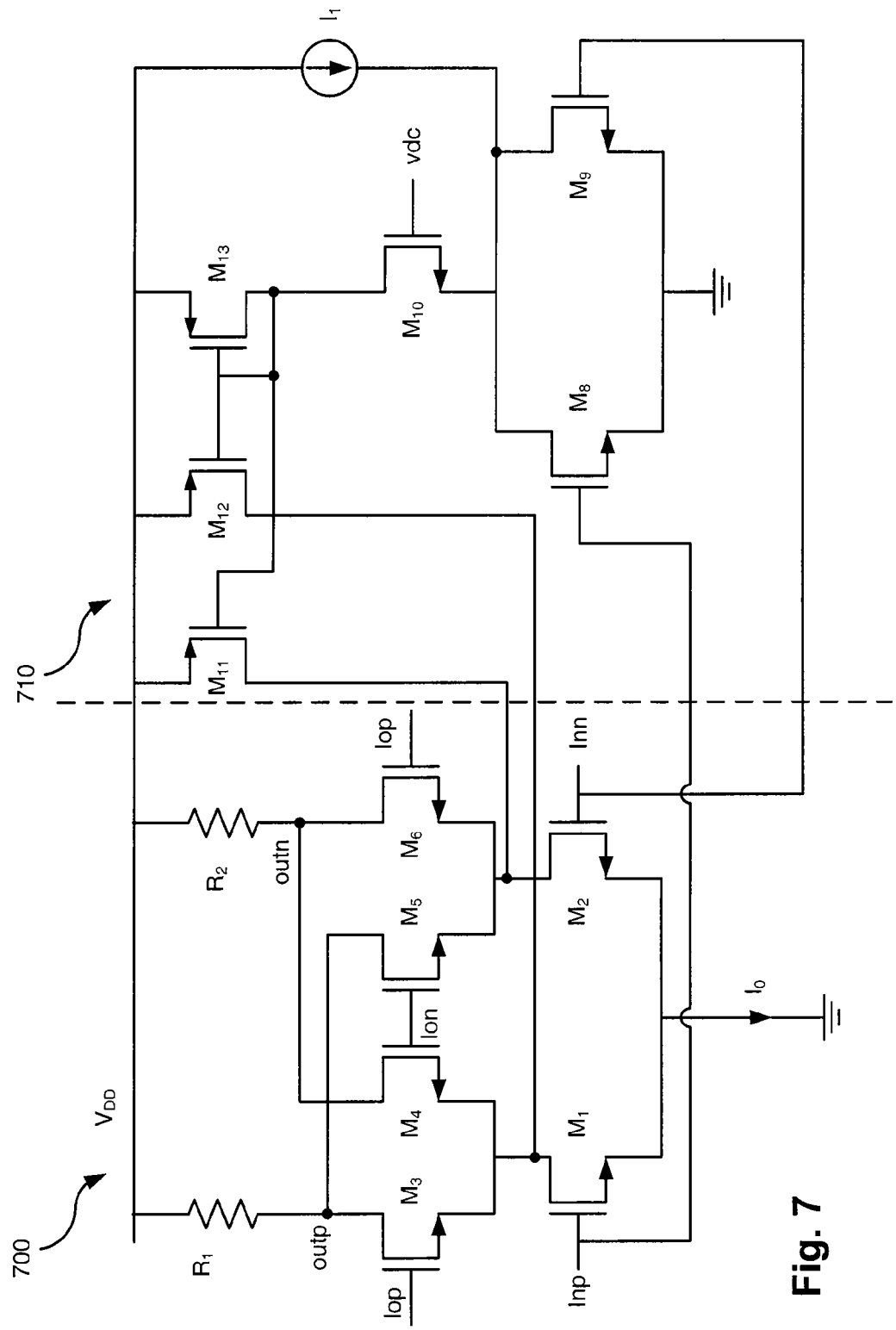
FIG. 7 is a schematic diagram of a common-source Gilbert cell double-balanced mixer circuit with a common-source current-matching IM2 suppression circuit according to a second embodiment.

FIG. 7 is a schematic diagram of a common-source Gilbert cell double-balanced mixer circuit 700 with a current-matching IM2 suppression circuit 710 according to a second embodiment. The common-source Gilbert cell 700 is the same as the Gilbert cell 500 of FIG. 5, except that the bias transistor $M_0$ has been replaced with a connection straight from the sources of transconductors $M_1$ and $M_2$ to ground. The purpose of the common-source configuration of the Gilbert cell 700 is to increase the voltage headroom for $M_1$ and $M_2$, which is beneficial as the supply voltage $V_{DD}$ is lowered to reduce power consumption. The disadvantage of the common-source Gilbert cell 700 is that IM2 terms are increased relative to the fundamental terms due to the degraded common-mode rejection ratio of the common-source configuration. This increases the importance of IM2 suppression.

The current-matching IM2 suppression circuit 710 is the same as the current-matching IM2 suppression circuit 510 of FIG. 5, except for the replacement of the bias transistor $M_7$ with a connection straight from the sources of the duplicate transconductors $M_8$ and $M_9$ to ground. The operation of the common-source current-matching IM2 suppression circuit 710 is unchanged, in that IM2 current in the duplicate transconductors $M_8$ and $M_9$ still mirrors that in transconductors $M_1$ and $M_2$, so the suppression achieved by the common-source current-matching IM2 suppression circuit 710 is still substantial. The common-source current-matching IM2 suppression circuit 710 can therefore relax the tradeoff between IP2 and voltage headroom as the supply voltage $V_{DD}$ is lowered.

Table 3 compares the simulated performance of the common-source Gilbert cell 700 without the common-source current-matching IM2 suppression circuit 710 with that of the common-source Gilbert cell 700 with the common-source current-matching IM2 suppression circuit 710 at an operating frequency of 900 MHz:

TABLE 3

Comparison of common-source Gilbert cell performance without and with IM2 suppression circuit

|  | Without IM2 suppression circuit | With IM2 suppression circuit |
| --- | --- | --- |
| Gain | 4.2 dB | 4.9 dB |
| Single-ended IIP2 | 5.9 dBm | 19.4 dBm |
| Noise figure | 16.3 dB | 16.1 dB |
| IIP3 | 6.7 dBm | 8.1 dBm |
| Current @ 1.8 V | 2.5 mA | 2.7 mA |

Table 3 shows that that the IIP2 point is 13.5 dB higher with the common-source current-matching IM2 suppression circuit 710, without significantly worsening gain, noise figure, power consumption, or the IIP3 point.

The foregoing describes only some embodiments of the present invention, and modifications and/or changes can be made thereto without departing from the scope and spirit of the invention, the embodiments being illustrative and not restrictive.

The invention claimed is:

1. A circuit for suppression of second-order intermodulation in a double-balanced mixer circuit, the circuit comprising:

a duplicate transconductor element for duplicating AC current in a transconductor pair of the double-balanced mixer circuit;

a fundamental cancellation element for cancelling a fundamental component of an AC current of the duplicate transconductor element, while preserving a second-order intermodulation component; and a phase inversion element for feeding an output current of the fundamental cancellation element to the transconductor pair of the double-balanced mixer circuit, thereby substantially removing the second-order intermodulation component from a differential output of the double-balanced mixer circuit.

2. A circuit according to claim 1, wherein the phase inversion element reverses the direction of the output current of the fundamental cancellation element.

3. A circuit according to claim 1, wherein the fundamental cancellation element comprises a connection between the outputs of the duplicate transconductor element.

4. A circuit according to claim 3, wherein the fundamental cancellation element further comprises a cascade transistor for matching DC drain-source voltages of the duplicate transconductor element and the transconductor pair of the double-balanced mixer circuit.

5. A circuit according to claim 1, wherein the phase inversion element comprises a current mirror for mirroring the output current of the fundamental cancellation element.

6. A circuit according to claim 5, wherein:

the duplication by the duplicate transconductor element includes a size scaling factor between 0 and 1; and the current mirror is adapted to divide the output current of the fundamental cancellation element by twice the scaling factor.

7. A circuit according to claim 1, wherein the duplicate transconductor element is biased in the same condition as the transconductor pair of the double-balanced mixer circuit.

8. A circuit according to claim 7, wherein duplicate transconductor element comprises a duplicate bias transistor that duplicates a bias transistor of the double-balanced mixer circuit.

9. A circuit according to claim 7, wherein the transconductor pair of the double-balanced mixer circuit is common-source, and the duplicate transconductor element comprises a common-source transconductor pair.

10. A circuit according to claim 1, further comprising a DC current source connected to the output of the duplicate transconductor element.

11. A circuit according to claim 1, wherein the duplicate transconductor element has the same differential inputs as the transconductor pair of the double-balanced mixer circuit.

* * * * *